(12) United States Patent
Ang et al.

(10) Patent No.: US 6,403,425 B1
(45) Date of Patent: Jun. 11, 2002

(54) DUAL GATE OXIDE PROCESS WITH REDUCED THERMAL DISTRIBUTION OF THIN-GATE CHANNEL IMPLANT PROFILES DUE TO THICK-GATE OXIDE

(75) Inventors: Chew-Hoe Ang; Wenhe Lin; Jia Zhen Zheng, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/995,191

(22) Filed: Nov. 27, 2001

(51) Int. Cl.[7] ................. H01L 21/8234; H01L 21/8236; H01L 21/336; H01L 21/31
(52) U.S. Cl. ............. 438/283; 438/275; 438/276; 438/286; 438/763
(58) Field of Search ................. 438/283, 216, 438/275, 276, 286, 199, 763

(56) References Cited

U.S. PATENT DOCUMENTS

| 5,989,949 A | | 11/1999 | Kim et al. ............. 438/217 |
|---|---|---|---|
| 6,010,925 A | * | 1/2000 | Hsieh ............. 438/197 |
| 6,033,943 A | | 3/2000 | Gardner ............. 438/199 |
| 6,171,911 B1 | | 1/2001 | Yu ............. 438/275 |
| 6,174,775 B1 | * | 1/2001 | Liaw ............. 438/283 |
| 6,214,674 B1 | | 4/2001 | Tung ............. 438/275 |
| 6,268,250 B1 | | 7/2001 | Helm ............. 438/275 |
| 6,344,383 B1 | * | 2/2002 | Berry et al. ............. 438/221 |
| 6,346,445 B1 | * | 2/2002 | Hsu ............. 438/279 |

* cited by examiner

Primary Examiner—Alexander G. Ghyka
(74) Attorney, Agent, or Firm—George O. Saile; Rosemary L. S. Pike

(57) ABSTRACT

A new method is provided for the creation of layers of gate oxide of different thicknesses. A substrate is provided, the surface of the substrate is divided into a first surface region over which a thick layer of gate oxide has to be created and a second surface region over which a thin layer of gate oxide is to be created. Thick gate-oxide implants are performed into the surface of the substrate. A thick layer of gate oxide is created over the surface of the substrate, the thick layer of gate oxide is successively patterned for thin gate-oxide implants, comprising thin gate-oxide n-well/p-well, threshold, punchthrough implants, into the second surface region of the substrate. The thick layer of gate oxide is removed from the second surface region of the substrate. The (now contaminated) top layer of the thick layer of gate oxide is removed, a thin layer of gate oxide is grown over the second surface region of the substrate.

36 Claims, 3 Drawing Sheets

DUAL GATE OXIDE PROCESS WITH REDUCED THERMAL DISTRIBUTION OF THIN-GATE CHANNEL IMPLANT PROFILES DUE TO THICK-GATE OXIDE

BACKGROUND OF THE INVENTION (1) Field of the Invention

The invention relates to the fabrication of integrated circuit devices, and more particularly, to a method of improved channel implant for a dual-gate oxide process.

(2) Description of the Prior Art

The creation of Complementary Metal Oxide Field Effect Transistors (CMOSFET) is well known in the art of creating semiconductor devices whereby both p-channel (PMOS) and n-channel (NMOS) devices are concurrently created over the surface of a silicon substrate. The simultaneous creation of PMOS and NMOS devices offers obvious advantages of reduced production costs in addition to reduced overall heat being created by the devices due to their duality of operation, which allows for increased device density. PMOS and NMOS devices have found wide acceptance, mostly aimed at digital applications where low-current, high performance devices operating as basic inverter devices are most beneficially applied. The popularity of FET devices is in no small measure due to their high packaging, low power consumption and high yields.

The creation of a CMOS device typically starts with the definition of the active surface region of the substrate over which the devices are to be created by creating regions of Field Oxide Isolation (FOX) or Shallow Trench Isolation (STI) in the surface of the substrate. The surface of the substrate has been provided with a level of conductivity by doping the substrate with for instance a p-type impurity such as boron or indium, forming a p-type well in the surface of the substrate. Next, a thin layer of gate oxide is fabricated over the surface of a single crystal semiconductor substrate. To reduce short channel effect that is caused by ultra-short device feature size, Lightly Doped Drain (LDD) are implanted in addition to the implant of source and drain regions. A layer of polysilicon is deposited over the layer of gate oxide and etched using photolithography followed by anisotropic poly etch. The anisotropic poly etch typically stops on the gate oxide, for applications where the layer of gate oxide is very thin this etch stop can easily become a problem resulting in the etch for the poly gate proceeding into the underlying substrate.

Gate spacers, which electrically isolate the gate electrode, are formed over sidewalls of the gate electrode. The implanted ions of the LDD can be further driven into the surface of the substrate before the gate spacers are formed by heating the substrate to a temperature of between 700 and 900 degrees C., a process that at the same time restores any damage to the surface of the substrate that the LDD ion implant may have caused. The gate spacer material that has been deposited over the gate structure is etched back from all regions other than the sidewalls of the gate electrode by applying an anisotropic dry etchback that removes most of the gate spacer material and only leaves gate spacer material in place where it was most densely deposited, that is on the sidewalls of the gate electrode. The remaining step of forming the source and drain regions of the gate electrode is performed by an impurity implant, which uses the same type impurity as has been used for the LDD implant but provides the implanted ions with higher dopant concentration and implant energy, thereby creating deeper regions of impurity with higher concentration of these impurities.

Current creation of dual-gate oxide layers comprises performing a number of implants, such as thin-gate well and punchthrough implants and Vt implant, that are performed prior to the formation of the dual-gate layer of gate oxide. Of particular concern for devices having a channel length of 100 nm or less is the profile on the channel implant in order to obtain optimum device performance. However, the high-thermal budget that is required for the (furnace based) thick gate oxidation adversely affects the profile of the channel implant of the thin-gate oxide regions. The invention addresses this concern by providing a method that reduces the impact that the thick-gate oxidation has on the profile of the channel implant underneath the thin-gate oxide layer.

U.S. Pat. No. 6,171,911 B1 (Yu) shows a dual gate oxide process in addition to p-type and n-type wells.

U.S. Pat. No. 6,033,943 (Gardner) reveals a dual gate oxide process using masking steps.

U.S. Pat. No. 5,989,949 (Vines), U.S. Pat. No. 6,214,674 B1 (Tung) and U.S. Pat. No. 6,268,250 B1 (Helm) are related gate oxide and well processes.

SUMMARY OF THE INVENTION

A principle objective of the invention is to provide an improved method for the dual-gate oxide process that reduces the impact of thick-gate oxidation on the channel implant profile underneath the thin-gate region.

In accordance with the objectives of the invention a new method is provided for the creation of layers of gate oxide of different thicknesses. A substrate is provided, the surface of the substrate is divided into a first surface region over which a thick layer of gate oxide has to be created and a second surface region over which a thin layer of gate oxide is to be created. Regions of field isolation are provided in the surface of the substrate. Thick gate-oxide implants, comprising n-well or p-well, threshold, punchthrough implants, are performed into the surface of the substrate. A thick layer of gate oxide is created over the surface of the substrate, the thick layer of gate oxide is patterned with a first photoresist mask for first thin gate-oxide implants, comprising thin gate-oxide n-well, threshold, punchthrough implants, into the second surface region of the substrate. The first thin gate-oxide implants are performed, the first photoresist mask is replaced with a second photoresist mask for second thin gate oxide implants, comprising thin gate-oxide p-well, threshold, punchthrough implants, into the second surface region of the substrate. The second thin-gate implants are performed, the second photoresist mask is replaced with a third photoresist mask for removal of the thick layer of gate oxide from the second surface region of the substrate. The thick layer of gate oxide is removed from the second surface region of the substrate, the third photoresist mask is removed, exposing the thick layer of gate oxide overlying the first surface region of the substrate. The (now contaminated) top layer of the thick layer of gate oxide is removed, a thin layer of gate oxide is grown over the second surface region of the substrate.

DESCRIPTION OF THE PREFERRED EMBODIMENTS

The performance of CMOS devices is inversely proportional to the thickness of the layer of gate oxide that is provided underneath the gate electrode of the device. It is therefore not uncommon the encounter a thickness of the layer of gate oxide for advanced, high-performance devices in the region of 100 Angstrom or less where even more advanced devices are being created having a thickness for the layer of gate dielectric of 20 Angstrom.

One of the well-known advantages of the application of Complementary Metal Oxide Silicon (CMOS) devices is the reduced power consumption that can be achieved with these devices. This reduced power consumption is achieved by the fact that the CMOS devices use both n-channel and p-channel CMOS devices, whereby only one of the two transistors is on at any given time and virtually no current flows because of the high impedance of the device.

The invention will now be described in detail using FIGS. 1 through 7.

Figure 1:
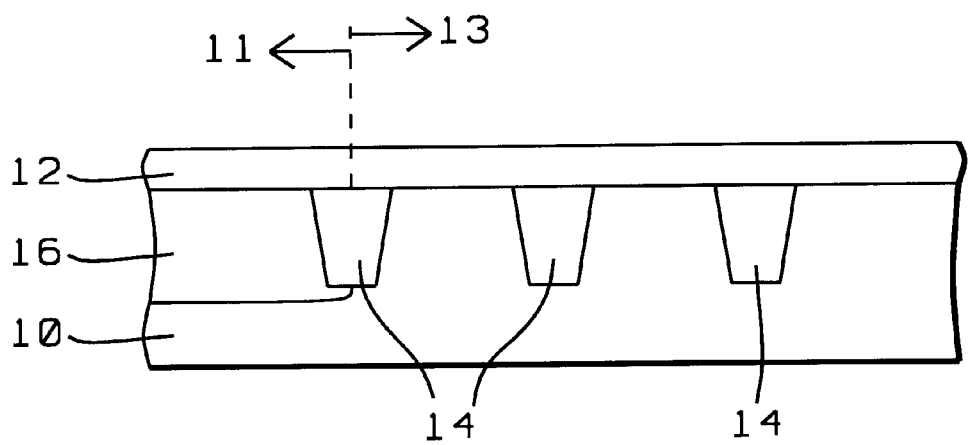
FIG. 1 is a cross section of a substrate, regions of field isolation have been formed in the surface of the substrate, the substrate is divided into a first surface region over which a thick layer of gate oxide has to be created and a second surface region over which a thin layer of gate oxide is to be created. Thick gate-oxide implants have been performed into the surface of the substrate. A thick layer of gate oxide is created over the surface of the substrate.

Referring specifically to the cross section that is shown in FIG. 1, there is shown:

10, the cross section of a monocrystalline silicon substrate over the surface of which the dual-gate oxide layers of the invention are to be created 11, the surface region of substrate 10 that has been selected as being the surface region over which a thick layer of gate oxide is to be created 13, the surface region of substrate 10 that has been selected as being the surface region over which a thin layer of gate oxide is to be created 12, a layer of gate-oxide that is created over surfaces 11 and 13, this layer 12 of gate oxide is a relatively thick layer of gate oxide having a thickness of between about 80 and 120 Angstrom 14, Shallow Trench Isolation (STI) regions that have been created in the surface of substrate 10 in order to electrically isolate adjacent gate electrodes from each other 16, an n-well or p-well implant that is performed under the surface region of substrate 10 over which a thick layer of gate oxide is to be created.

The n-well and p-well implants are here mentioned without differentiating between these two kinds of implants reflecting that, over the surface 11 of relatively thick gate-oxide, both NMOS (over a p-well) and PMOS (over an n-well) can be created. The invention does not require nor imply that these two types of implants need to be performed in a manner that differs from conventional impurity procedures for the creation of NMOS/PMOS devices over a relatively thick layer of gate oxide.

Prior to the creation of layer 12 of thick gate oxide, the conventional implants such as punchthrough and threshold voltage implants have been performed into the surface region 11 of the substrate, that is the surface of the substrate over which a thick layer of gate oxide is to be created. These implants have not been further highlighted in the cross section that is shown in FIG. 1. No impurity implant has at this time been performed in surface 13 of substrate 10, that is the surface region over which a thin layer of gate oxide is to be created.

To specifically address one of these impurity implants, CMOS devices that are created having sub-micron device features are subject to problems of source to drain region punch-through, most notably occurring MOSFET devices having in short-channel dimensions which can result in degradation of insulating characteristics of the devices. The problem of source/drain punch-through is typically resolved by performing a punch-through-stop ion implantation in the device substrate prior to the formation of the CMOS device gate electrode. This ion implant is performed prior to forming the field oxide for the gate electrode.

The deposition of layer 12 of gate oxide can be performed following any of the conventional methods of forming a layer of gate oxide such as by thermal oxidation of the underlying silicon, in an oxidation steam ambient at a temperature between about 850 and 1,000 degrees C. Layer 12 can also be formed in conjunction with a deposited silicon dioxide layer, nitride layer, a composite oxide or nitride oxide material or any other material suitable for use as a gate dielectric. Gate oxide can be grown at a temperature of 800 to 1,000 degrees C. to a thickness between about 80 and 120 Angstrom.

STI regions 14 can be made using a variety of methods. For instance, one method is the Buried Oxide (BOX) isolation used for shallow trenches. The method involves filling the trenches with a chemical vapor deposition (CVD) silicon oxide ($SiO_2$) which is then etched back or mechanically/chemically polished to yield a planar surface. The shallow trenches etched for the BOX process are anisotropically plasma etched into the silicon substrate, typically to a depth between 2,000 and 5,000 Angstrom and are formed around active devices that are created in or on the surface of a substrate.

In a CMOS type semiconductor device, the NMOS device is formed over a p-well region while the PMOS device is formed over an n-well region. Single well structures have the disadvantage that impurity concentration in the well region is too high resulting in a decrease of the device operating speed. For high speed operating devices, it is therefore required that the device is fabricated having a twin well structure whereby both p-well and n-well regions are formed in the substrate and both well regions have low impurity concentrations. Optimizing impurity concentrations for the n and p-well regions must in this case optimize device performance.

The formation of p-well and n-well regions in the surface of a substrate is well known in the art. The conventional CMOS devices are formed in and on single crystalline silicon semiconductor substrates by fabricating the n-channel NMOS devices in p-wells in the silicon substrate while fabricating PMOS devices in n-wells in the silicon substrate. The p-well is formed in the active device regions by ion implanting a p-type dopant such as boron ($B^{11}$) or indium in the p-well regions. The n-well is formed in the active device regions by ion implanting an n-type dopant such as arsenic ($Ar^{75}$) or phosphorous in the n-well regions. Conventional photolithographic techniques are used to form implant block-out masks to prevent implanting the p-type dopant in the n-well and the n-type dopant in the p-well. The substrate is then annealed to achieve the desired dopant profile, to activate the dopant and to remove dopant implant damage. Typically, the wells are between about 2.0 and 4.0 $\mu$m deep and are doped to a concentration between about 1.0E15 and 1.0E17 atoms/cm$^3$.

Figure 2:
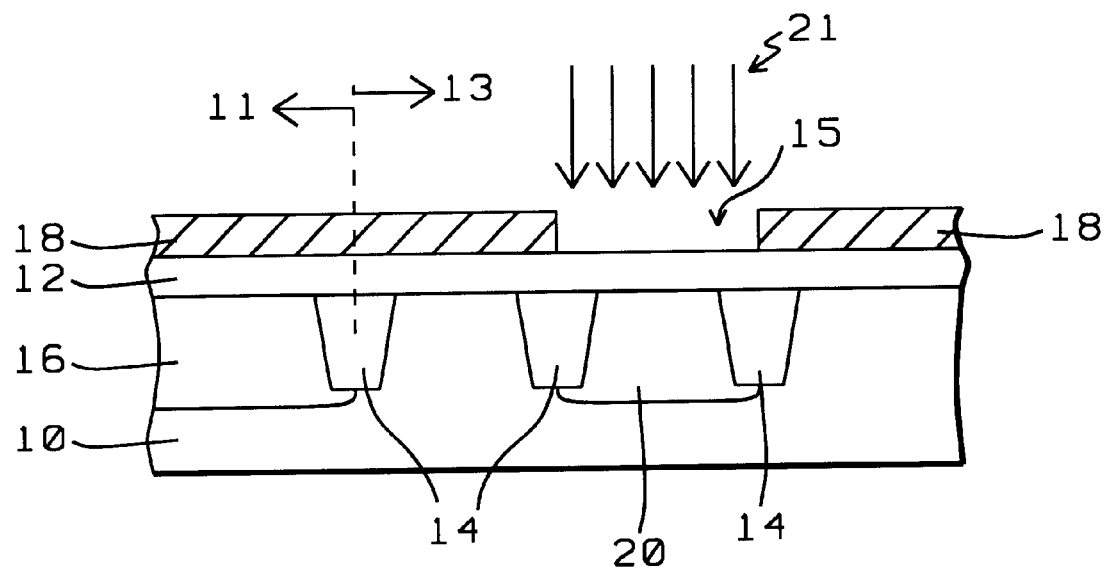
FIG. 2 shows a cross section after the surface of the thick layer of gate oxide is patterned for first thin gate-oxide implants into the surface of the substrate.

Referring now to the cross section that is shown in FIG. 2, highlighted are the following elements:

18, a first mask of photoresist that has been created overlying the thin-gate oxide region 13; the opening 15 that has been created in the first photoresist-mask 18 exposes the surface of substrate 10 where a thin-gate n-well, punchthrough and threshold voltage implants must be made 20, a thin-gate n-well formed in the surface of the thin-gate oxide region 13 of the surface of substrate 10

21, thin-gate n-well, punchthrough and threshold voltage implants performed into the surface of the thin-gate oxide region 13 of the surface of substrate 10.

First photoresist mask 18 is formed using conventional methods of photolithography and masking. Layer 18 of photoresist can be etched by applying $O_2$ plasma and then wet stripping by using $H_2SO_4$, $H_2O_2$ and $NH_4OH$ solution. The opening 15 that is in this manner created in the layer 18 of photoresist exposes the surface of the layer 12 of thick gate oxide where the above cited impurity implants are to be performed.

After the structure that has been shown in cross section in FIG. 2 has been created and the required implants have been performed, the first photoresist mask 18 is removed from the surface of the thick oxide layer 12, using well known methods of ashing in an $O_2$ plasma followed by a thorough surface clean.

Figure 3:
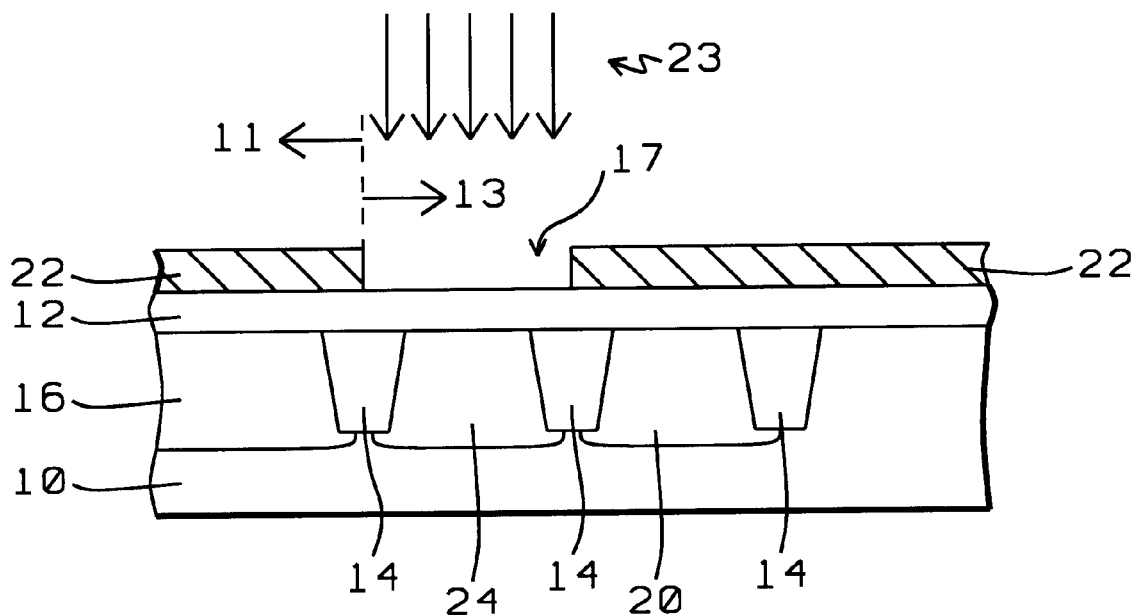
FIG. 3 shows a cross section after the surface of the thick layer of gate oxide is patterned for second thin gate-oxide implants into the surface of the substrate.

This is followed by the formation of a second photoresist mask 22, FIG. 3, over the surface of thick gate oxide layer 22. Opening 17 is created in the second layer 22 of photoresist, this opening 17 aligns with the surface area of substrate 10 into which thin-gate p-well, punchthrough and threshold voltage implants 23 must be performed. Thin-gate p-well 24 is created in the surface of substrate 10 as a consequence thereof. The preferred impurity of the invention for the threshold implant, which has collectively been highlighted with the thin-gate p-well, punchthrough been highlighted as implant 23 in FIG. 3, is indium.

Figure 4:
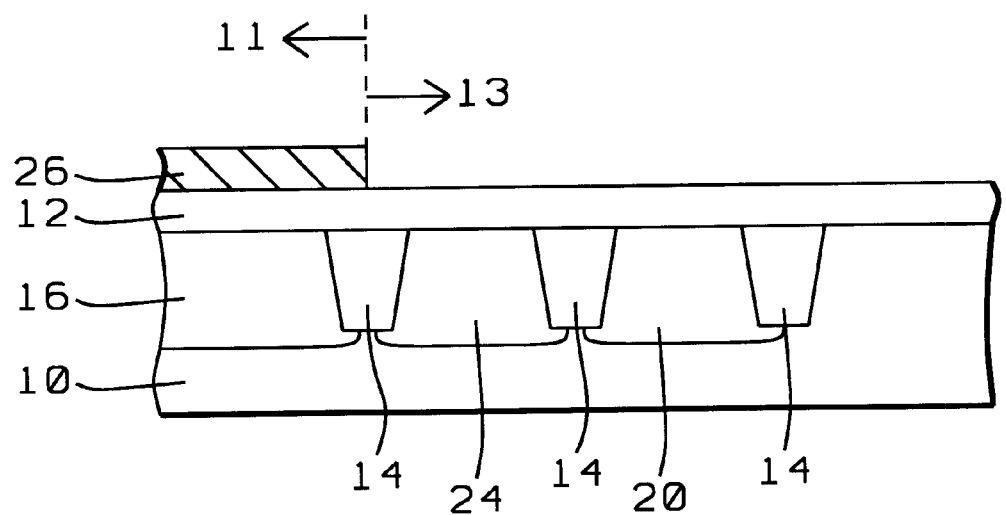
FIG. 4 shows a cross section after the surface of the thick layer of gate oxide has been patterned for removal of this layer from above the surface of the substrate over which a thin layer of gate-oxide is to be created.

After the above highlighted impurity implants have been performed, the second photoresist mask 22, FIG. 3, is removed from the surface of the thick oxide layer 12 and replaced with a third photoresist mask 26, FIG. 4. The cross section of FIG. 4 shows how a third photoresist mask 26 has been created. The third photoresist mask 26 overlies the thick-gate oxide surface region 11 and exposes the thin-gate oxide region 13. Conventional methods for the creation of a photoresist mask are applied for the creation of the third photoresist mask 26.

Figure 5:
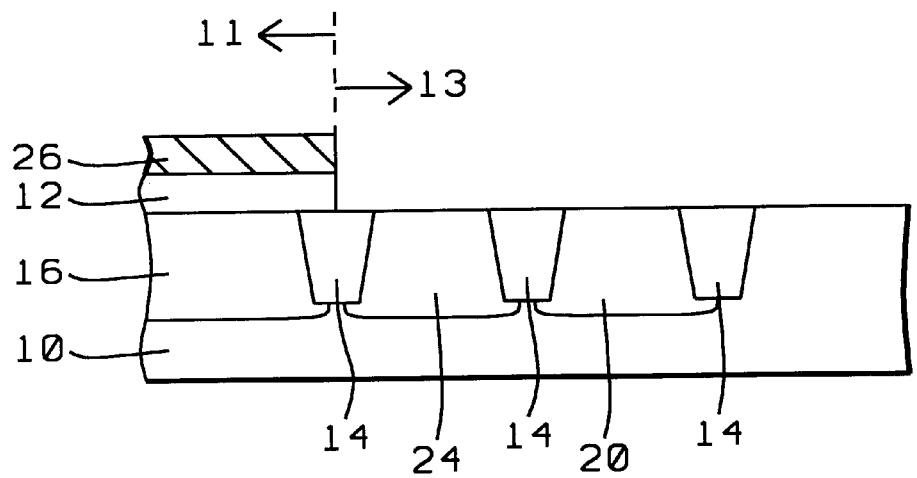
FIG. 5 shows a cross section after the thick layer of gate oxide has been removed from above the surface of the substrate over which a thin layer of gate-oxide is to be created.

FIG. 5 shows how the invention proceeds with the complete removal of the thick layer 12 of gate oxide in accordance with the photoresist mask 26, removing the thick layer of gate oxide from above the surface of the substrate where a thin layer of gate oxide must be created. The etch of layer 12 as shown in cross section in FIG. 5 applies diluted HF (DHF) (diluted by about 100:1) after which the third photoresist mask 26 is removed from the surface of the remaining layer 12 of thick gate oxide, again applying conventional methods of photoresist removal.

It is at this time of value to briefly review the various implanted well regions in the surface of substrate 10 using FIG. 5, as follows:
1. region 16, which is a thick gate oxide n-well or p-well
2. region 24, which is a thin gate oxide p-well
3. region 20, which is a thin gate oxide n-well.

Figure 6:
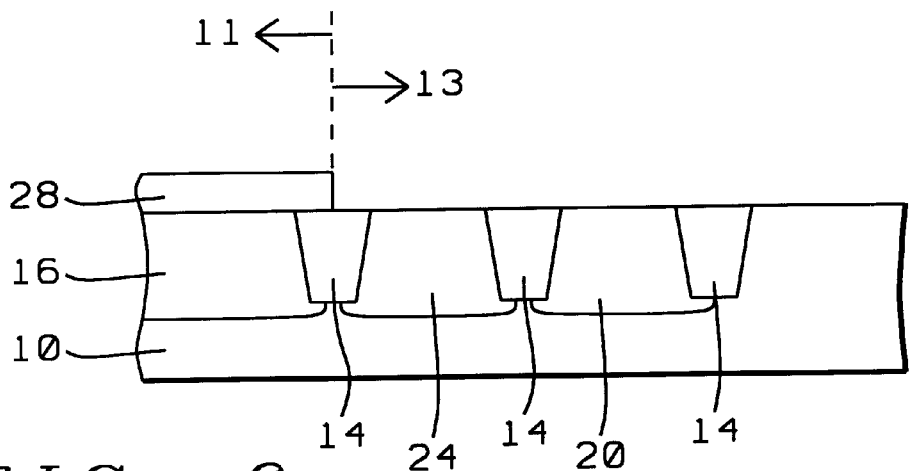
FIG. 6 shows a cross section after the photomask has been removed, the top surface of the remaining thick layer of gate-oxide has been removed.
Figure 7:
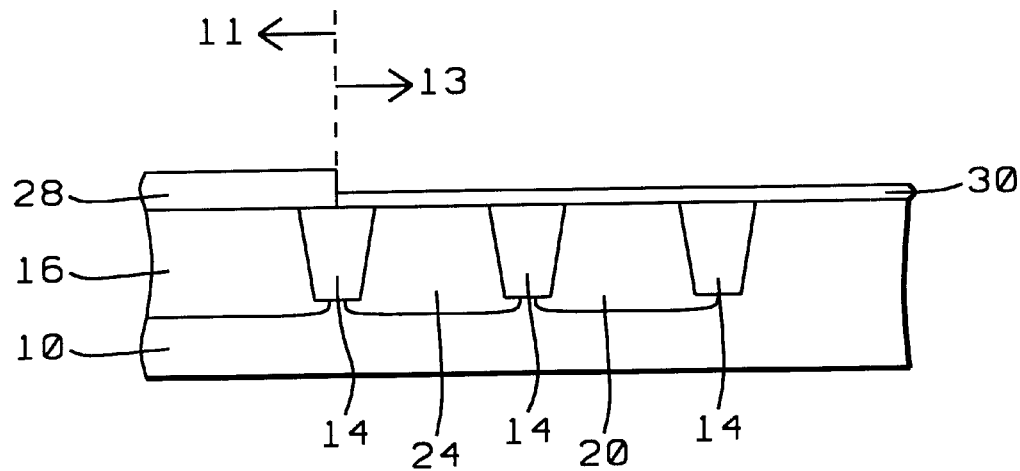
FIG. 7 shows a cross section after a thin layer of gate-oxide has been created over the second surface area of the substrate.

The cross section that is shown in FIG. 6 appears to be a Cross-section wherein only the removal of the third photoresist mask 26 is highlighted. In addition to this however the cross section of FIG. 6 also means to highlight the processing step whereby the contaminated top surface of the remaining layer 12 of thick gate oxide is removed using diluted HF (DHF) (diluted between about 100:1 and 200:1).

The thickness of layer 12 is as a consequence reduced from the original value of between about 80 and 120 Angstrom to a value between about 40 and 70 Angstrom, creating a new layer 28 of gate oxide which is still a relatively thick layer of gate oxide.

After this step of the reduction of the thickness of layer 12 is completed, a pre-thin gate RCA clean is performed of the surface of the structure that is shown in cross section in FIG. 6. The structure is then ready for the creation of a thin layer of gate oxide overlying surface region 13 of substrate 10. The preferred method of the invention for the creation of thin oxide layer 30 is by applying Rapid Thermal Oxidation, using a single processing chamber, thus reducing the thermal budget of this processing step 15. The second layer of gate dielectric is created to a second thickness of between about 10 and 50 Angstrom.

From the above detailed description it is clear that the invention has provided a method for creating two layers of gate oxide of different thicknesses while conventional impurity implants into the surface of the substrate for threshold and-the like have not been inhibited or impaired by the invention.

The invention, of creating dual-gate oxide layers with reduced thermal re-distribution of the thin-gate channel implant caused by thick-gate oxidation, can be summarized as follows:

the invention starts with a substrate, over the surface of the substrate has been designated a first surface area over which a thick layer of gate dielectric must be created and a second surface area over which a thin layer of gate dielectric must be created, required impurity implants have been performed into the first surface area of the substrate, regions of field isolation have been provided in the surface of the substrate a first layer of gate dielectric having a first thickness is created over the surface of the substrate a first exposure mask is created over the surface of the first layer of gate dielectric, the first exposure mask comprises at least one opening overlying the second surface of the substrate over which at least one PMOS device is to be created first impurity implants are performed using the first exposure mask as an implant mask the first exposure mask is removed from the surface of the first layer of gate dielectric a second exposure mask is created over the surface of the first layer of gate dielectric, the second exposure mask comprises at least one opening overlying the second surface of the substrate over which at least one NMOS device is to be created second impurity implants are performed using the second exposure mask as an implant mask the second exposure mask is removed from the surface of the first layer of gate dielectric a third mask is created over the surface of the first layer of gate dielectric, the third mask exposes the surface of the first layer of gate dielectric where the first layer of gate dielectric overlies the second surface of the substrate the first layer of gate dielectric is removed from the second surface of the substrate, using the third mask as an etch mask, exposing the second surface of the substrate the third mask is removed from the surface of the first layer of gate dielectric the thickness of the first layer of gate dielectric is reduced by a measurable amount, and a second layer of gate dielectric having a second thickness is created over the second surface of the substrate.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating dual-gate oxide layers with reduced thermal re-distribution of the thin-gate channel implant caused by thick-gate oxidation, comprising the steps of:

providing a substrate, over the surface of said substrate having been designated a first surface area over which a thick layer of gate dielectric must be created and a second surface area over which a thin layer of gate dielectric must be created, required impurity implants having been performed into the first surface area of said substrate, regions of field isolation having been provided in the surface of said substrate;

creating a first layer of gate dielectric having a first thickness over the surface of said substrate;

creating a first exposure mask over the surface of said first layer of gate dielectric, said first exposure mask comprising at least one opening overlying the second surface of said substrate over which at least one PMOS device is to be created;

performing first impurity implants using said first exposure mask as an implant mask;

removing said first exposure mask from the surface of said first layer of gate dielectric;

creating a second exposure mask over the surface of said first layer of gate dielectric, said second exposure mask comprising at least one opening overlying the second surface of said substrate over which at least one NMOS device is to be created;

performing second impurity implants using said second exposure mask as an implant mask;

removing said second exposure mask from the surface of said first layer of gate dielectric;

creating a third mask over the surface of said first layer of gate dielectric, said third mask exposing the surface of said first layer of gate dielectric where said first layer of gate dielectric overlies the second surface of said substrate;

removing said first layer of gate dielectric from the second surface of said substrate, using said third mask as an etch mask, exposing said second surface of said substrate;

removing said third mask from the surface of said first layer of gate dielectric;

reducing the thickness of said first layer of gate dielectric by a measurable amount; and creating a second layer of gate dielectric having a second thickness over said second surface of said substrate.

2. The method of claim 1, said first exposure mask and said second exposure mask and said third mask comprising photoresist.

3. The method of claim 1, said first layer of gate dielectric comprising oxide.

4. The method of claim 1, said first layer of gate dielectric being created to a first thickness of between about 80 and 120 Angstrom.

5. The method of claim 1, said required impurity implants having been performed into the first surface area of said substrate being selected from the group of implants consisting of n-well implant and p-well implant and punchthrough implant and threshold voltage implant.

6. The method of claim 1, said regions of field isolation having been provided in the surface of said substrate comprising regions of Shallow Trench Isolation.

7. The method of claim 1, said first impurity implants being selected from the group of implants consisting of n-well implant and punchthrough implant and threshold voltage implant.

8. The method of claim 1, said second impurity implants being selected from the group of implants consisting of p-well implant and punchthrough implant and threshold voltage implant.

9. The method of claim 8, said threshold voltage implant preferably using indium as source of impurity ions.

10. The method of claim 1, said removing said first layer of gate dielectric from the second surface of said substrate comprising applying HF chemistry whereby said HF is diluted in a ratio of about 100:1.

11. The method of claim 1, said reducing the thickness of said first layer of gate dielectric by a measurable amount comprising applying HF chemistry whereby said HF is diluted in a ratio of between about 100:1 and about 200:1.

12. The method of claim 1, said reducing the thickness of said first layer of gate dielectric by a measurable amount comprising reducing said first thickness to a thickness of between about 40 and 70 Angstrom.

13. The method of claim 1, said creating a second layer of gate dielectric over said second surface of said substrate comprises Rapid Thermal Oxidation of said second surface of said substrate using a single processing chamber.

14. The method of claim 1, with an additional step of performing pre-thin gate surface clean, said additional step being performed prior to said step of creating a second layer of gate dielectric over said second surface of said substrate.

15. The method of claim 1, said second layer of gate dielectric being created to a second thickness of between about 10 and 50 Angstrom.

16. A method of creating dual-gate layers of gate dielectric, comprising the steps of:

(a) providing a substrate, the surface of said substrate having been divided into surface regions, said surface regions having been electrically isolated from each other, said regions being:

(1) region 1 over which PMOS devices having a thick layer of gate dielectric must be created;

(2) region 2 over which NMOS devices having a thick layer of gate dielectric must be created;

(3) region 3 over which PMOS devices having a thin layer of gate dielectric must be created;

(4) region 4 over which NMOS devices having a thin layer of gate dielectric must be created;

(b) performing first impurity implants into the surface of region 1;

(c) performing second impurity implants into the surface of region 2;

(d) creating a first layer of gate dielectric having a first thickness over the surface of said substrate;

(e) performing third impurity implants into the surface of region 3;

(f) performing fourth impurity implants into the surface of region 4;

(g) removing said first layer of gate dielectric from above surface regions 3 and 4; and (f) creating a second layer of gate dielectric having a second thickness over the surface of regions 3 and 4 of said substrate.

17. The method of claim 16, said first and third impurity implants into the surface region 1 being selected from the group of implants consisting of n-well implant and punch-through implant and threshold voltage implant.

18. The method of claim 16, said second and fourth impurity implants into the surface region 1 being selected from the group of implants consisting of p-well implant and punchthrough implant and threshold voltage implant.

19. The method of claim 16, said first layer of gate dielectric comprising oxide.

20. The method of claim 16, said first layer of gate dielectric being created to a first thickness of between about 80 and 120 Angstrom.

21. The method of claim 16, said surface regions having been electrically isolated from each other comprising creating regions of Shallow Trench Isolation in the surface of said substrate.

22. The method of claim 16, said fourth impurity implant preferably using indium as source of impurity ions for a threshold voltage implant.

23. The method of claim 16, said creating a second layer of gate dielectric over the surface of regions 3 and 4 of said substrate comprising Rapid Thermal Oxidation of said second surface of said substrate using a single processing chamber.

24. The method of claim 16, with an additional step of performing pre-thin gate surface clean, said additional step being performed prior to said step of creating a second layer of gate dielectric over the surface of regions 3 and 4 of said substrate.

25. The method of claim 16, said second layer of gate dielectric being created to a second thickness of between about 10 and 50 Angstrom.

26. The method of claim 16, said performing first and second impurity implants comprising performing impurity implants into the bare surface of said substrate.

27. The method of claim 16, said performing third impurity implants into the surface of region 3 comprises the steps of:

creating a first exposure mask over the surface of said first layer of gate dielectric, said first exposure mask comprising at least one opening over the surface of said first layer of gate dielectric, said at least one opening overlying the surface of said region 3;

performing third impurity implants using said first exposure mask as an implant mask; and removing said first exposure mask from the surface of said first layer of gate dielectric.

28. The method of claim 27, said first exposure mask comprising photoresist.

29. The method of claim 16, said performing fourth impurity implants into the surface of region 4 comprises the steps of:

creating a second exposure mask over the surface of said first layer of gate dielectric, said second exposure mask comprising at least one opening over the surface of said first layer of gate dielectric, said at least one opening overlying the surface of said region 4;

performing fourth impurity implants using said second exposure mask as an implant mask; and removing said second exposure mask from the surface of said first layer of gate dielectric.

30. The method of claim 29, said second exposure mask comprising photoresist.

31. The method of claim 16, said removing said first layer of gate dielectric from above surface regions 3 and 4 comprising the steps of:

creating a third mask over the surface of said first layer of gate dielectric, said third mask exposing the surface of said first layer of gate dielectric where said first layer of gate dielectric overlies regions 3 and 4 in the surface of said substrate;

removing said first layer of gate dielectric from the surface of regions 3 and 4 of said substrate, using said third mask as an etch mask, exposing said the surface of regions 3 and 4 of said substrate; and removing said third mask from the surface of said first layer of gate dielectric.

32. The method of claim 31, said third mask comprising photoresist.

33. The method of claim 19, with an additional step of reducing a thickness of said first layer of dielectric by a measurable amount, said additional step being performed prior to said step of creating a second layer of gate dielectric over the surface of regions 3 and 4 of said substrate.

34. The method of claim 33, said reducing the thickness of said first layer of gate dielectric by a measurable amount comprising applying HF chemistry whereby said HF is diluted in a ratio of between about 100:1 and about 200:1.

35. The method of claim 33, said reducing the thickness of said first layer of gate dielectric by a measurable amount comprising reducing said first thickness to a thickness of between about 40 and 70 Angstrom.

36. The method of claim 16, said removing said first layer of gate dielectric from above regions 3 and 4 of said substrate comprising applying HF chemistry whereby said HF is diluted in a ratio of about 100:1.

* * * * *